(12) United States Patent
Wang

(10) Patent No.: US 7,116,743 B1
(45) Date of Patent: Oct. 3, 2006

(54) DIGITAL PHASE LOCK LOOP

(75) Inventor: Hsi-Chen Wang, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/794,080

(22) Filed: Mar. 4, 2004

Related U.S. Application Data

(60) Provisional application No. 60/451,892, filed on Mar. 4, 2003.

(51) Int. Cl.
*H04L 7/04* (2006.01)
(52) U.S. Cl. ...................................... 375/362; 327/159
(58) Field of Classification Search ................. 331/16; 375/354, 362, 371, 373, 375, 376; 327/141, 327/147, 150, 156, 159
See application file for complete search history.

(56) References Cited

U.S. PATENT DOCUMENTS

| | | | | |
|---|---|---|---|---|
| 5,636,192 A | * | 6/1997 | Shimizume et al. | 369/47.28 |
| 6,052,034 A | * | 4/2000 | Wang et al. | 331/2 |
| 6,067,071 A | * | 5/2000 | Kotha et al. | 345/698 |
| 6,404,247 B1 | * | 6/2002 | Wang | 327/158 |
| 6,959,064 B1 | * | 10/2005 | Spijker et al. | 375/376 |

* cited by examiner

*Primary Examiner*—Timothy P. Callahan
*Assistant Examiner*—Cassandra Cox
(74) *Attorney, Agent, or Firm*—Christopher P. Maiorana, P.C.

(57) ABSTRACT

Techniques of designing a digital phase lock loop are disclosed. In one embodiment, the digital phase lock loop comprises a synchronization unit producing a producing a plurality of clock signals in accordance with a seed clock signal having a frequency, each of the clock signals having a modified frequency over the frequency of the seed clock signal and a phase shift from each other; a phase-frequency detection unit receiving an input signal and a feedback signal, and sampling the input signal and the feedback signal in accordance with the clock signals to determine differences in phase and frequency between the input signal and the feedback signal; a digital control oscillator receiving the clock signals and producing an output signal in reference to the differences from phase-frequency detection unit, and subsequently, a digitally controlled clock signal is produced.

19 Claims, 6 Drawing Sheets

1. PLL_SYN
The function of this block is to generate 16 equally different phase clock running at 16 times of input frequency Input: clk
Output: fvco0 fvco1 fvco2 fvco3 fvco4 fvco5 fvco6 fvco7 fvco8
fvco9 fvco10 fvco11 fvco12 fvco13 fvco14 fvco15 fvco16

This timing shows when PLL is approaching to LOCK state, the phase difference of HSYNC and Fbref is conciliatorily converging to LOCK.

DIGITAL PHASE LOCK LOOP

CROSS-REFERENCE TO RELATED APPLICATION

This application claims the benefits of U.S. Provisional Application No. 60/451,892, filed Mar. 4, 2003, and entitled "Digital Phase Lock Loop," which is hereby incorporated by reference for all purposes

BACKGROUND OF THE INVENTION

1. Field of the Invention

The present invention generally relates to the area of integrated circuit designs, and more particularly, relates to designs of digital phase lock loop.

2. Description of the Related Art

Traditionally, a phase-locked loop (PLL) is an electronic circuit with a voltage- or current-driven oscillator that is constantly adjusted to match in phase (and thus lock on) the frequency of an input signal. In addition to stabilizing a particular communications channel (keeping it set to a particular frequency), a PLL can be used to generate a signal, modulate or demodulate a signal, reconstitute a signal with less noise, or multiply or divide a frequency. PLLs are frequently used in wireless communication, particularly where signals are carried using frequency modulation (FM) or phase modulation (PM). PLLs can also be used in amplitude modulation (AM). PLLs are more commonly used for digital data transmission, but can also be designed for analog information. Phase-locked loop devices are more commonly manufactured as integrated circuits (ICs).

A traditional PLL includes a voltage-controlled oscillator (VCO) that is tuned using a special semiconductor diode called a varactor. The VCO is initially tuned to a frequency close to the desired receiving or transmitting frequency. A circuit called a phase comparator causes the VCO to seek and lock onto the desired frequency, based on the output of a crystal-controlled reference oscillator. This works by means of a feedback scheme. If the VCO frequency departs from the selected crystal reference frequency, the phase comparator produces an error voltage that is applied to the varactor, bringing the VCO back to the reference frequency.

There are many uses of PLLs and most of the PLLs are traditionally implemented with analog approaches. However, when an input signal has a frequency that is extremely low or high, the traditional analog approaches start to demonstrate a certain degree of difficulty of keeping lock on that of the input signal. There is a need for techniques that implement a PLL with all digital approaches.

SUMMARY OF INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

According to one embodiment of the present invention, it is a digital phase lock loop comprises a signal synchronization unit producing a plurality of clock signals in accordance with a seed clock signal having a frequency, each of the clock signals having a modified frequency over the frequency of the seed clock signal and a phase shift from each other; a digital control oscillator receiving the clock signals and producing an output signal in reference to a received signal, wherein the output signal is fed back to a phase-frequency detection unit in which a phase and/or frequency of an input signal is detected and compared with the output signal from the digital control oscillator that is modified by a divider; and subsequently, a digitally controlled clock signal is produced.

Optionally, a filter is provided to remove any artifacts in the signal and produces a precisely and digitally controlled clock signal.

One of the objects in the present invention is to provide a full digital phase lock loop that can be used in applications in which an input signal has a frequency to be locked too low.

Other objects and advantage together with the foregoing are attained in the exercise of the invention in the following description and resulting in the embodiments illustrated in the accompanying drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

The present invention pertains to designs of digital phase lock loop. One of the applications for such digital phase lock loop is for frequencies that may too low or too high. Different from the traditional analog phase lock loop, the present invention uses a signal synchronization unit to produce a plurality of clock signals in accordance with a seed clock signal having a frequency. Each of the clock signals from signal synchronization unit has a modified frequency over the frequency of the seed clock signal and a phase shift from each other. These clocks are used to sample an input signal (e.g., a horizontal sync signal in display application). The frequency of the input signal is detected and compared with the output signal from the digital control oscillator that is modified by a divider; and subsequently, a digitally controlled clock signal is produced.

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention. The detailed description is presented largely in terms of procedures, logic blocks, processing, and other symbolic representations that directly or indirectly resemble the operations of data processing devices coupled to networks. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1A:
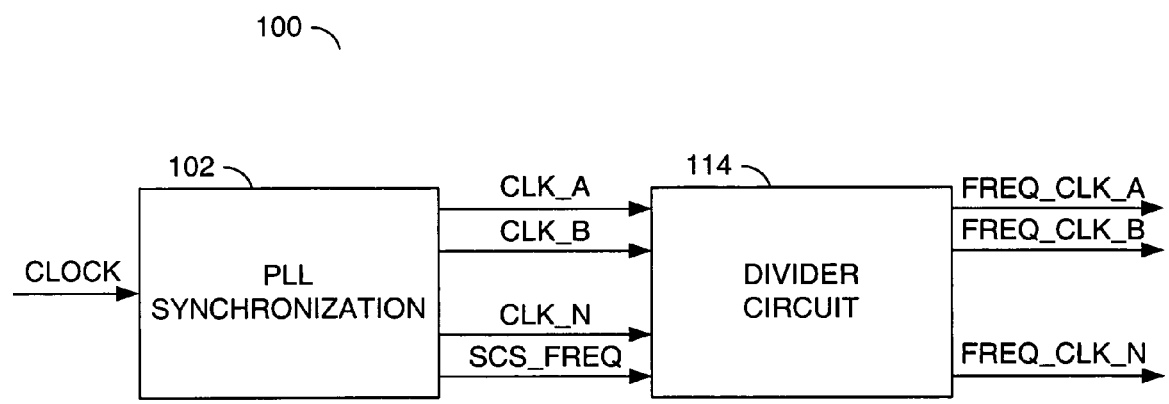
FIG. 1A' shows the generation of the frequency of each the clocks.

Referring now to the drawings, in which like numerals refer to like parts throughout the several views. FIG. 1A shows architecture of a digital PLL 100 according to one embodiment of the present invention. The architecture 100 includes a PLL synchronization unit 102, a phase-frequency detection unit 104, a digital control oscillator 106, dividers 108 and 110, and a filter 112.

The synchronization unit 102 receives a seed clock signal with a frequency and produces a plurality of clock signals with a frequency modified based on the frequency of the seed clock signal, each of the clock signals has a phase shift over each other. According to one embodiment, the modified frequency as well as the phase shift are dependent on an input signal received at the phase-frequency detection unit 104.

Figure 1B:
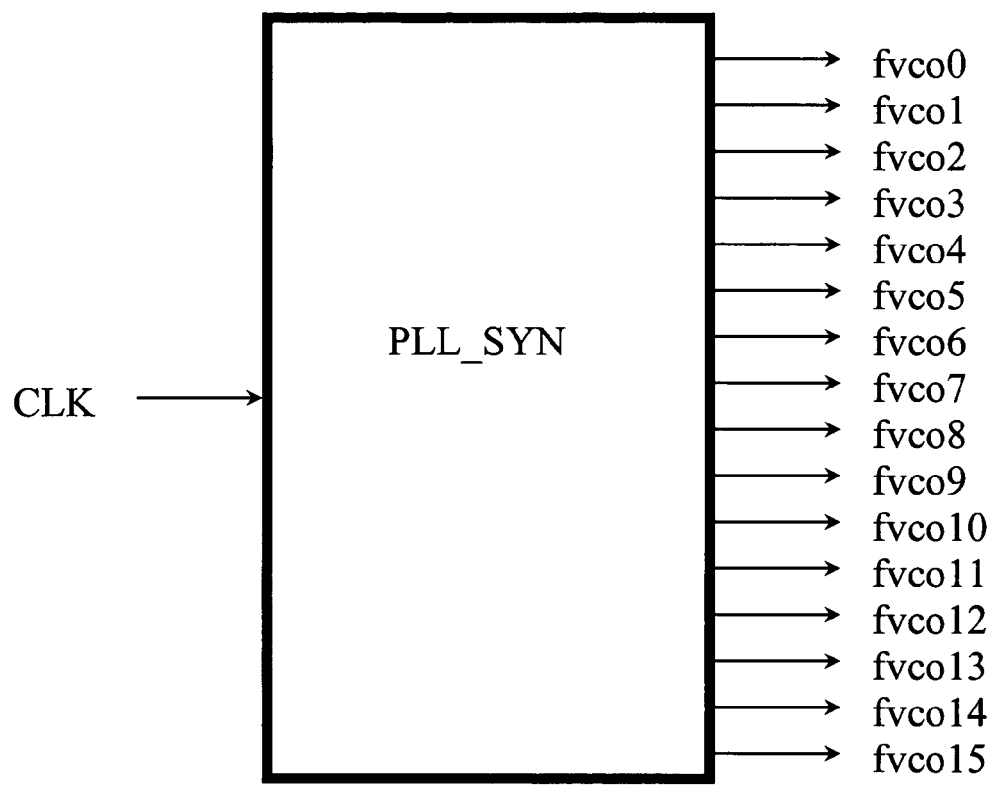
FIG. 1B shows a mapping relationship of the digital PLL.
Figure 1C:
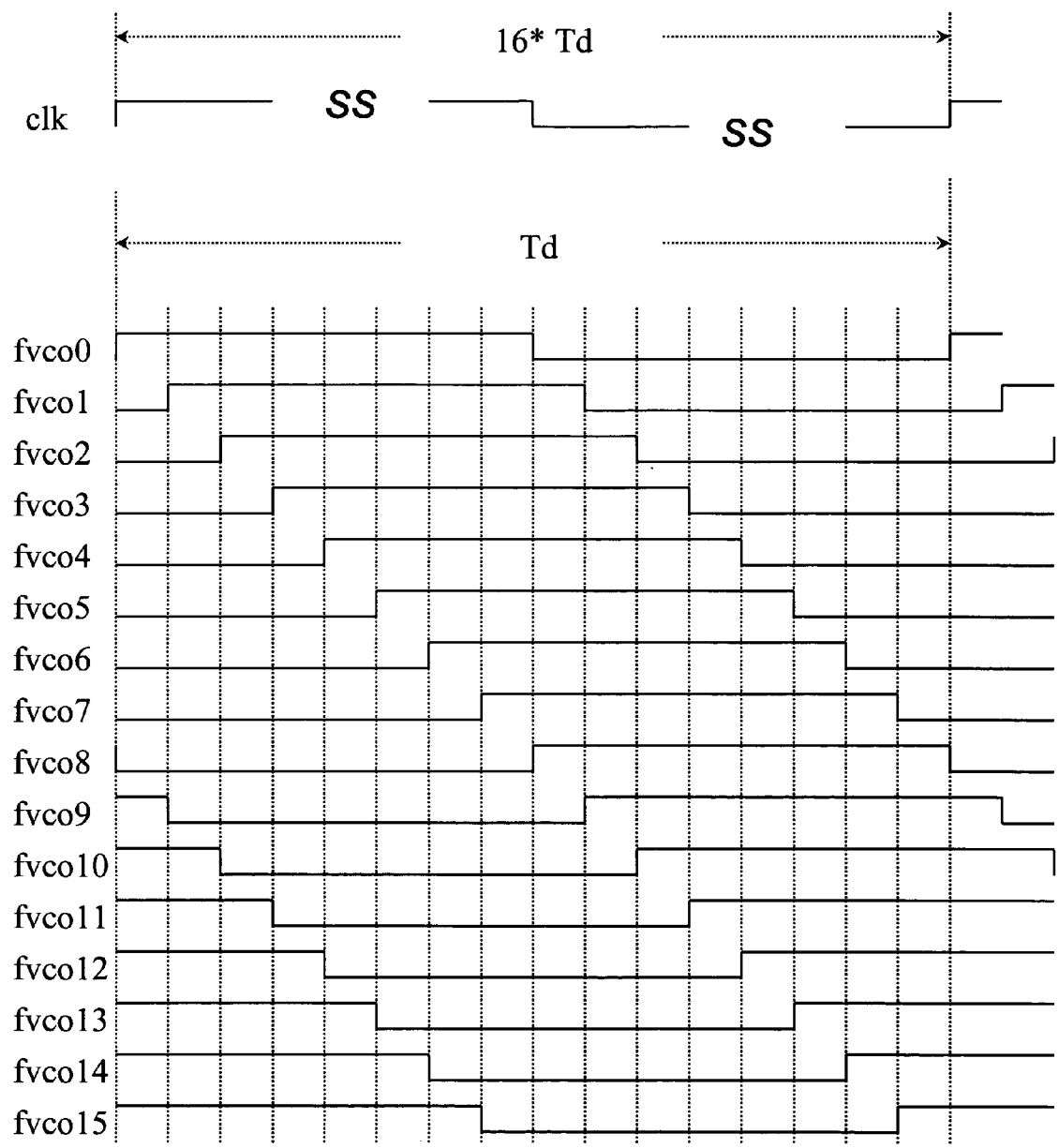
FIG. 1C shows 16 clock signals in accordance with a clock signal.

For example, the input signal received at the phase-frequency detection unit 104 is a video horizontal sync signal (very low frequency) and it is desired to produce 16 clock signals from a seed clock signal of 14.318 MHz in the synchronization unit 102. The modified frequency is 14.318×16=229.088 MHz. Accordingly, the outputs from the synchronization unit 102 include 16 clock signals with a phase difference being 272.821 ps (pico-second). In general, one of the 16 clock signals is considered as a main one (e.g., a first one of the 16 clock signals, and the rest is derived from a ring oscillator, not shown in the figure). FIG. 1B shows a mapping relationship of the digital PLL 100, and FIG. 1C shows 16 clock signals in accordance with a CLK signal.

Referring to FIG. 1A', a portion of the architecture 100 is shown illustrating the generation of the frequency of each clock. The synchronization unit 102 generates N clocks (e.g., CLK_A–CLK_N). A divider circuit 114 receives the frequency of the seed clock signal (e.g., SCS_FREQ) and the N clocks. The synchronization circuit 102 and the divider circuit 114 generates the frequency of the each clocks (e.g., FREQ_CLK_A–FREQ_CLK_N). In general, the frequency of each the clocks is the frequency of the seed clock signal divided by N clocks.

Different from the voltage-controlled oscillator (VCO) in the traditional DLL, the DCO 106 receives the clock signals from the synchronization unit 102 and generates one or more signals that are coupled to at least two dividers 108 and 110. One divided signal (or signals) from the divider 108 is sent to the phase-frequency detection unit 104. With an input signal received at the other end, the phase-frequency detection unit 104 is configured to detect the phase and/or frequency of the input signal in accordance with the clock signals received from the synchronization unit 102.

According to one embodiment, the clock signals received from the synchronization unit 102 are used to sample the input signals 120 and 122. The samples of both signals are computed for the phase and frequency. Any errors between the samples are used to regulate the digital control oscillator (DCO) 106. The output of the DCO 106 is provided to the divider 110 for being scaled down and, as an input 122, to the phase-frequency detection unit 104. In one embodiment, the divider 110, as well as the divider 108, is programmable, the exact divider thereof is determined, for example from the display resolution.

Relying on the feedback loop including the DCO 106, the divider 110 and the PFD 104, detection errors can be eventually minimized and the phase and/or frequency can be precisely detected. As a result, a precisely and digitally controlled signal is produced from the DCO 106. Different from the PLL systems in the prior art, the feedback loop as disclosed herein comprises digital operations.

The signal from the DCO 106 is coupled to the divider 108 that receives a divider value. The divided signal from DCO 106 is provided to the filter 112 that subsequently filters out any phase quantization noises and produces original frequency in the input signal.

Figure 2:
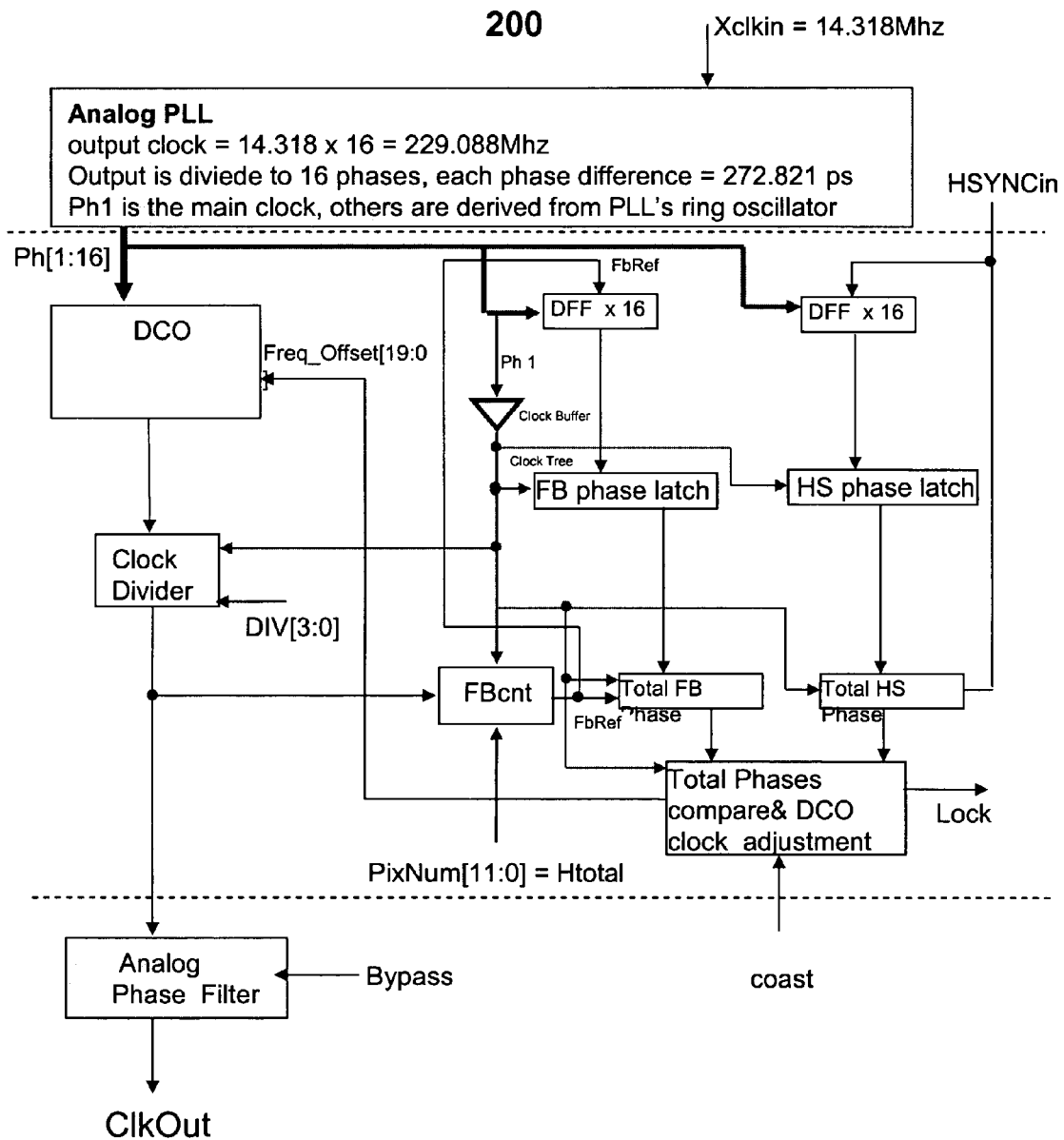
FIG. 2 shows an embodiment of the present invention for video display applications.

FIG. 2 shows an embodiment 200 of the present invention for video display applications. One of the video display applications is to drive liquid crystal displays (LCDs) which is the most common application of liquid crystal technology. From the ubiquitous wrist watch and pocket calculator to an advanced VGA computer screen, this type of display has evolved into an important and versatile interface. A liquid crystal display includes an array of tiny segments (called pixels) that can be manipulated to present information visually. This basic idea is common to all digital displays, ranging from simple calculators to a full color LCD television.

The following table shows signals that may be provided from a source (e.g. a desktop computer).

| Type | Name | Description |
| --- | --- | --- |
| Input | RST_ | PLL system reset |
| Input | HSYNC | HSYNC input |
| Input | Xclkin | External Crystal clock input |
| Input | Bypass | Bypass Analog Low pass Filter enable |
| Input | Coast | DCO stop adjust, keep in previous number |
| Input | Pix_num[11:0] | Video mode Horizontal total pixel number |
| Output | LOCK | LOCK signal indicates PLL in LOCK state |
| Output | CLKout | Digital PLL output clock |

It should be noted that the output pixels clock frequency is usually in hundreds MHZ range, the input HSYNC signal as a reference signal to generate output pixel clock, but the HSYNC frequency is too low, below 100 KHz in most cases. The traditional analog PLL approach is very difficult to keep in the LOCK state. By virtue of the present invention, the functional diagram 100 in FIG. 1 and the embodiment 200 shown in FIG. 2 can sufficiently lock on the frequency of the input signal and at the same time, provide noise immunity (e.g., from substrate, voltage or temperature variations).

The input HSYNC is the reference clock to the circuit 200 to generate pixel clocks. It needs phase lock detection and frequency lock detection circuit to check the frequency, phase difference between input HSYNC and internal generated Fbref signal, the DCO will adjust its output based on these differences on each rising edge of HSYNC. The frequency difference has N gears (N-1 coarse, 1 fine) adjustment to DCO based on the difference number.

Figure 3:
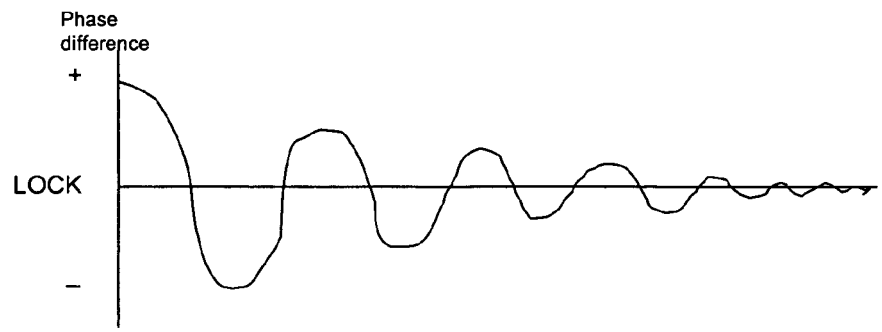
FIG. 3 shows fast convergence of approaching frequency lock with the difference being large.

If (hsync_total_phase>fbref_total_phase)
((hsync_total_phase−fbref_total_phase)>biggest number);
((hsync_total_phase−fbref_total_phase)>bigger number);
((hsync_total_phase−fbref_total_phase)>big number);
((hsync_total_phase−fbref_total_phase)>fine_tune_number);
If (fbref_total_phase>hsync_total_phase)
((fbref_total_phase−hsync_total_phase)>biggest number);
((fbref_total_phase−hsync_total_phase)>bigger number);
((fbref_total_phase−hsync_total_phase)>big number);
((fbref_total_phase−hsync_total_phase)>fine_tune_number);

The convergence of approaching frequency lock will be very fast if the difference is large, also the frequency lock play a dominate role if the difference is large as shown in FIG. 3. After the phase difference is reducing to phase/frequency fine-tune mode, the phase adjustment then starts its role to influence DCO clock frequency. While Fbclk is approaching PLL LOCK state, it is waving around HSYNC signal. The adjustment of DCO is toggling of phase adjustment and frequency adjustment on every other HSYNC input. If certain HSYNC lines are for frequency adjustment, but if hsync_total_phase is equal to fbref_total_phase, it will switch to adjust phase instead of adjusting frequency or vice versa. This will help to reduce lock-in time of PLL.

In the display application, the FBcnt value (PixNum[11:0]) for generating Fbref is fixed in each video mode. Because the pixel clock frequency output range is from 20 Mhz to over 200 Mhz, a clock divider is required to generate lower frequency output clock.

The purpose of the Analog Phase filter in FIG. 2 is to remove short-term jitter of each clock period because the clock is generated by a DCO (digital-controlled oscillator).

Figure 4:
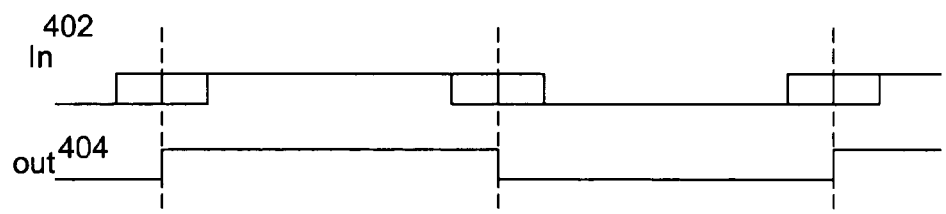
FIG. 4 shows a resultant signal from a divider or a feedback loop.
Figure 5:
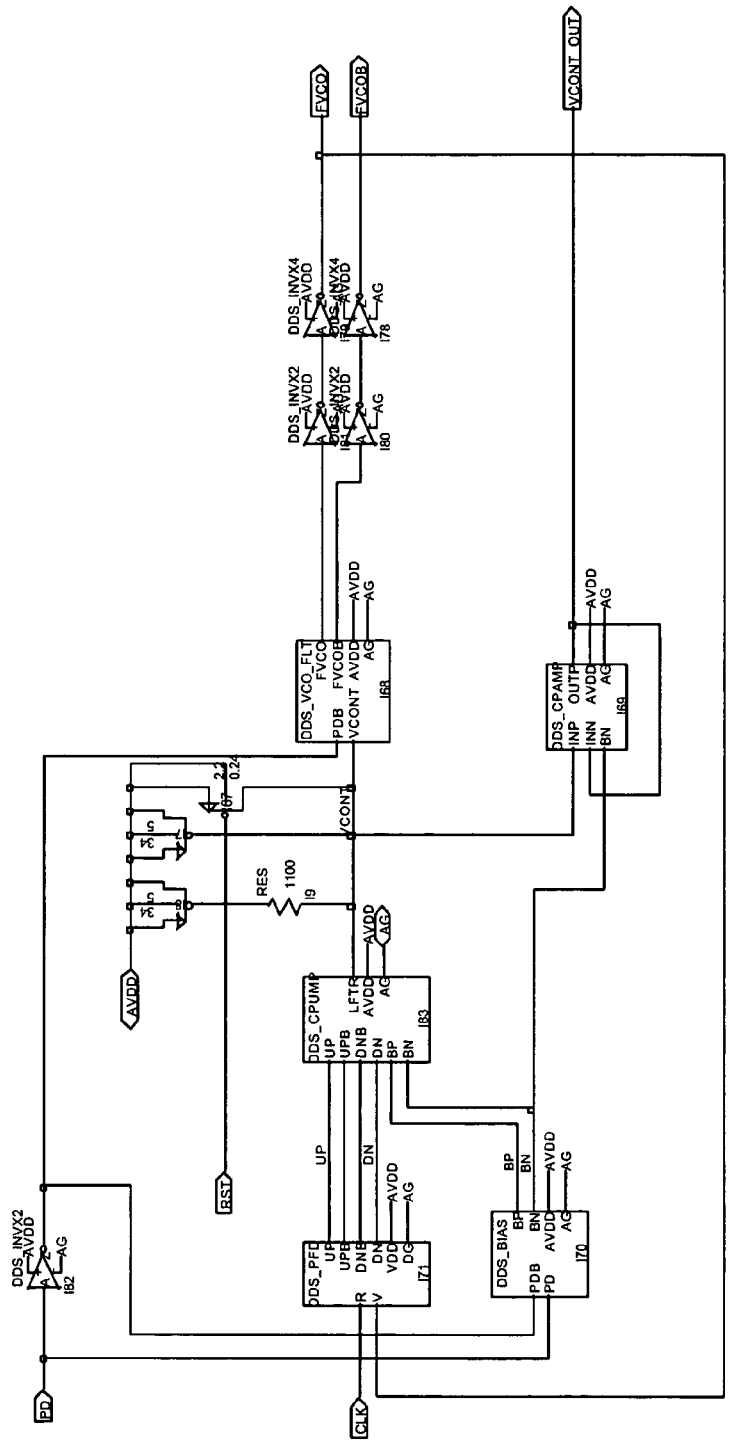
FIG. 5 shows a circuit design of a PLL filter according to one embodiment of the present invention.

Referring to FIG. 1, the filter 112 is used to filter out phase quantization noise and extract the original frequency clock. FIG. 4 shows a resultant signal 402 from the divider 110 or the feedback loop (formed by the PFD 104, the DCO 106 and the Divider 110). The filter 112 is configured to remove the noise and produce a clean clock signal 404. FIG. 5 shows a circuit design of the filter according to one embodiment of the present invention.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

I claim:

1. A digital phase lock loop comprising:
  a synchronization unit producing a plurality of clock signals in accordance with a seed clock signal having a frequency, each of the clock signals having (i) a modified frequency over the frequency of the seed clock signal and (ii) a phase shift from each other;
  a digital control oscillator receiving the clock signals and producing an output signal in reference to a received signal;
  a phase-frequency detection unit in which a phase and frequency of an input signal is detected and compared with the output signal from the digital control oscillator, wherein the received signal pertains to any errors between the input signal and the output signal;
  a filter (i) coupled to the digital control oscillator and (ii) configured to filter out possible noises in the output signal, wherein the output signal comprises a digitally controlled clock signal; and
  a first divider coupled between the digital oscillator and the filter, wherein the output signal is scaled down in the first divider and further filtered in the filter to produce a digitally controlled clock signal.

2. The digital phase lock loop of claim 1, wherein the output signal is modified by a second divider before being fed to the phase-frequency detection unit.

3. The digital phase lock loop of claim 2, wherein the first divider and the second divider are programmable.

4. The digital phase lock loop of claim 3, wherein a dividing factor of the first divider or the second divider is determined in accordance with a display resolution.

5. The digital phase lock loop of claim 4, wherein the digital phase lock loop is used to control a display having the display resolution.

6. The digital phase lock loop of claim 1, wherein the filter is configured to filter out phase quantization noise on the output signal and provide the original frequency of the input signal.

7. The digital phase lock loop of claim 1, wherein the input signal is implemented as a video horizontal synchronization signal having a low frequency.

8. A digital phase lock loop comprising:
  a synchronization unit producing a plurality of clock signals in accordance with a seed clock signal having a frequency, each of the clock signals having a modified frequency over the frequency of the seed clock signal and a phase shift from each other;
  a phase-frequency detection unit (i) receiving an input signal and a feedback signal and (ii) sampling the input signal and the feedback signal in accordance with the clock signals to determine differences in phase and frequency between the input signal and the feedback signal; and
  a digital control oscillator receiving the clock signals and producing an output signal in reference to the differences from phase-frequency detection unit, wherein a signal representing the differences is divided in a divider to be the feedback signal.

9. The digital phase lock loop of claim 8, wherein the signal representing the differences at the same time is fed to another divider coupled to a filter.

10. The digital phase lock loop of claim 9, wherein the filter is configured to filter out possible noise from the signal representing the differences.

11. The digital phase lock loop of claim 9, wherein the filter subsequently produces a digitally controlled clock signal.

12. The digital phase lock loop of claim 8, wherein there are N clocks, and the frequency of each of the clocks is the frequency of the seed clock signal divided by N.

13. The digital phase lock loop of claim 8, wherein the input signal is implemented as a video horizontal synchronization signal having a low frequency.

14. A digital phase lock loop comprises:
  a synchronization unit producing a plurality of clock signals in accordance with a seed clock signal having a frequency, each of the clock signals having a modified frequency over the frequency of the seed clock signal and a phase shift from each other;

a digital control oscillator receiving the clock signals and producing an output signal in reference to a received signal; and a phase-frequency detection unit in which a phase and frequency of an input signal is detected and compared with the output signal from the digital control oscillator, wherein (i) the received signal pertains to any errors between the input signal and the output signal, (ii) the output signal is modified by (a) a first divider before being fed to the phase-frequency detection unit and (b) a second divider to scale down the output signal, (iii) the first divider and the second divider are programmable, (iv) a dividing factor of the first divider and the second divider is determined in accordance with a display resolution, and (v) the digital phase lock loop is used to control a display having the display resolution.

15. The digital phase lock loop of claim 14, wherein the phase-frequency detection unit is configured to sample a feedback signal generated by the first divider and the input signal to determine differences in phase and frequency between the input signal and the feedback signal.

16. The digital phase lock loop of claim 14, wherein a filter is configured to subsequently produce a digitally controlled clock signal in response to said scaled down output signal.

17. The digital phase lock loop of claim 14, wherein the input signal is implemented as a video horizontal synchronization signal having a low frequency.

18. The digital phase lock loop of claim 16, wherein the filter is configured to filter out phase quantization noise on the output signal and provide the original frequency of the input signal.

19. The digital phase lock loop of claim 14, wherein the second divider is coupled between the digital control oscillator and a filter.

* * * * *